（12) United States Patent
Pulskamp

(10) Patent No.: US 10,271,437 B2
(45) Date of Patent: Apr. 23, 2019

(54) MOTION-BASED RECONFIGURABLE MICROELECTRONICS SYSTEM

(71) Applicant: U.S. Army Research Laboratory, Washington, DC (US)

(72) Inventor: Jeffrey Spencer Pulskamp, Fulton, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 617 days.

(21) Appl. No.: 14/825,855

(22) Filed: Aug. 13, 2015

(65) Prior Publication Data

US 2016/0050765 A1 Feb. 18, 2016

Related U.S. Application Data

(60) Provisional application No. 62/037,534, filed on Aug. 14, 2014.

(51) Int. Cl.
*H05K 3/30* (2006.01)
*H01L 27/20* (2006.01)
(Continued)

(52) U.S. Cl.
CPC .......... *H05K 3/303* (2013.01); *H01L 27/20* (2013.01); *H01L 41/094* (2013.01);
(Continued)

(58) Field of Classification Search
CPC ............ H05K 3/303; H05K 3/0008; H05K 2201/1009; H05K 2203/1509;
(Continued)

(56) References Cited

U.S. PATENT DOCUMENTS 4,127,432 A 11/1978 Kawano
4,375,126 A * 3/1983 Dull .................... H05K 13/0482
29/740
(Continued)

FOREIGN PATENT DOCUMENTS

WO WO2000057550 1/2001

OTHER PUBLICATIONS

Lohn, J.D., et al. "A Circuit Representation Technique for Automated Circuit Design," to appear in IEEE TRansactions on Evolutionary Computation, 1-15ti.arc.nasa.gov/m/pub-archive/86h/0086%20(Lohn).pdf.
(Continued)

*Primary Examiner* — A. Dexter Tugbang
*Assistant Examiner* — Azm Parvez
(74) *Attorney, Agent, or Firm* — Lawrence E. Anderson; Eric Brett Compton

(57) ABSTRACT

A system for controlled motion of circuit components to create reconfigurable circuits comprising: a support; a substrate operatively associated with the support; actuators operatively associated with the support configured to physically move circuit components and to move the circuit components into physical and electrical contact with the substrate; the substrate comprising at least one conductive segment arranged to electrically connect circuit components when electrical contacts of circuit components are placed in contact with at least one conductive segment; and control circuitry configured to control the first and second actuators to thereby position the circuit components relative to the substrate; whereby circuit function is determined by the selection of circuit components and the location and orientation of circuit components relative to the substrate and conductive segments to create a reconfigurable circuit.

14 Claims, 14 Drawing Sheets

(51) Int. Cl.
*H01L 41/09* (2006.01)
*H05K 1/02* (2006.01)
*H02N 2/00* (2006.01)
*H05K 3/00* (2006.01)

(52) U.S. Cl.
CPC .......... *H02N 2/0095* (2013.01); *H05K 1/029* (2013.01); *H05K 3/0008* (2013.01); *H05K 2201/1009* (2013.01); *H05K 2203/1509* (2013.01); *H05K 2203/173* (2013.01); *Y02P 70/613* (2015.11); *Y10T 29/53174* (2015.01)

(58) Field of Classification Search
CPC ... H05K 2203/173; H01L 27/20; H01L 41/20; H01L 41/0825; H01L 41/22; H01L 41/25; H01L 41/094; H01L 41/0986; H02N 2/02
USPC ........ 29/740, 739, 729, 700; 716/136; 714/3
See application file for complete search history.

(56) References Cited

U.S. PATENT DOCUMENTS

| | | | |
|---|---|---|---|
| 4,725,182 A | 2/1988 | Sakamato | |
| 5,094,381 A | 3/1992 | Amos et al. | |
| 5,722,527 A | 3/1998 | Van Gastel | |
| 6,125,043 A | 9/2000 | Hauer et al. | |
| 6,350,944 B1 | 2/2002 | Sherif et al. | |
| 6,844,852 B1 | 1/2005 | Simons | |
| 6,990,651 B2 | 1/2006 | Balasubramanian et al. | |
| 7,184,943 B1 | 2/2007 | Stoica | |
| 7,391,090 B2* | 6/2008 | Picciotto | H01L 21/485 200/181 |
| 7,532,093 B1 | 5/2009 | Pulskamp | |
| 7,858,423 B2 | 12/2010 | Siamak | |
| 7,876,026 B2 | 1/2011 | Pulskamp | |
| 8,010,826 B2 | 8/2011 | Reblewski | |
| 8,800,139 B2* | 8/2014 | Takayanagi | H05K 13/0417 29/739 |
| 8,925,190 B2* | 1/2015 | Endo | H05K 13/0413 29/832 |
| 2012/0047476 A1 | 2/2012 | Ward et al. | |
| 2014/0317588 A1 | 10/2014 | Teig et al. | |

OTHER PUBLICATIONS

Zhang, Chunna. "Reconfigurable RF Front End Components for Multi-Radio Platform Applications." Dissertation, Univ. Tennessee (2009).
Pister, Kristopher SJ. Ronald S. Fearing. and Roger T. Howe. "A planar air levitated electrostatic actuator system." Micro Electro Mechanical Systems, /990. Proceedings, An Investigation of Micro Structures, Sensors, Actuators, Machines and Robots. IEEE. IEEE, 1990.
Behringer, Karl F., et al. "Computational methods for design and control of MEMS micromanipulator arrays." Computational Science & Engineering, IEEE 4.1( 1997): 17-29.
Berlin, Andrew. et al. "Motion control of planar objects using large-area arrays of mems-like distributed manipulators." Xerox Palo Alto Research Center CAIUSA. presented at Micromechatronics (2000).
Suh, John W., "Fully programmable MEMS ciliary actuator arrays for micromanipulation tasks." Robotics and Automation, 2000. Proceedings. ICRA '00. IEEE International Conference on. vol. 2. IEEE. 2000.
Mann, William R .. et al. "The leading edge of production wafer probe test technology." Test Conference, 2004. Proceedings. ITC 2004. International. IEEE, 2004.

* cited by examiner

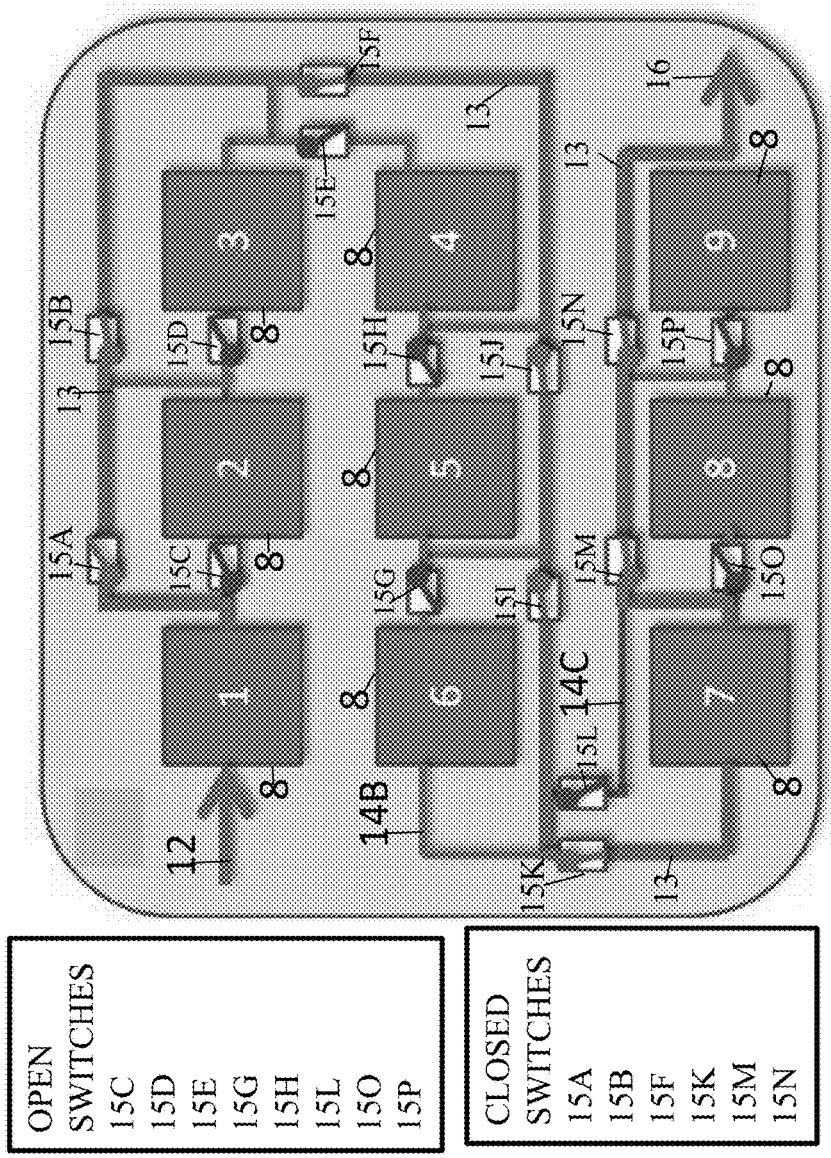
FIG. 3A Example of switched array approach with series chain of RF components connected by pairs of RF switches for selectable routing. Chips #1 and #7 are connected in series
FIG. 3B Equivalent circuit for the RFactory.

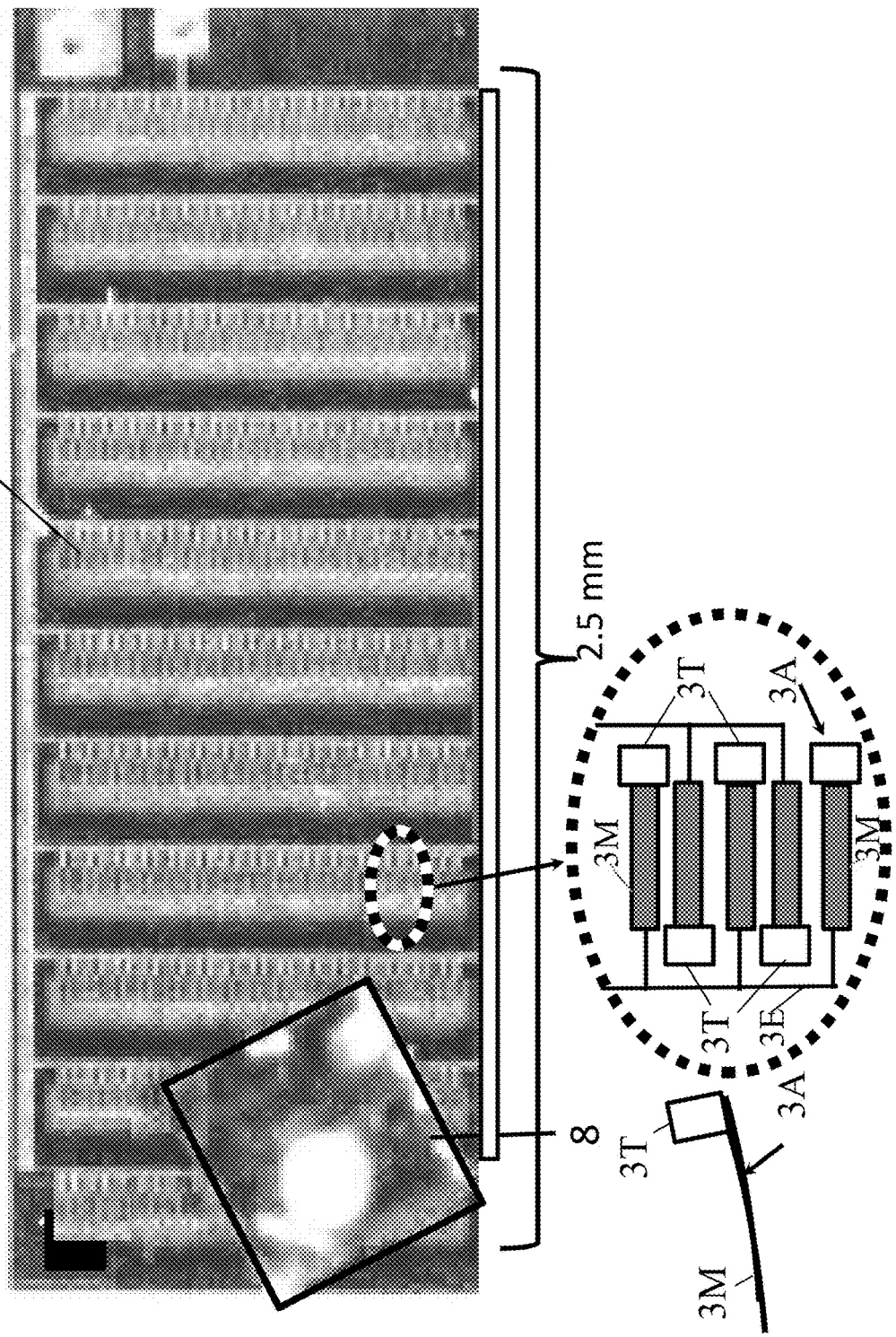
FIG. 4A  PZT MEMS Actuator Surface

2-D Actuator Surface

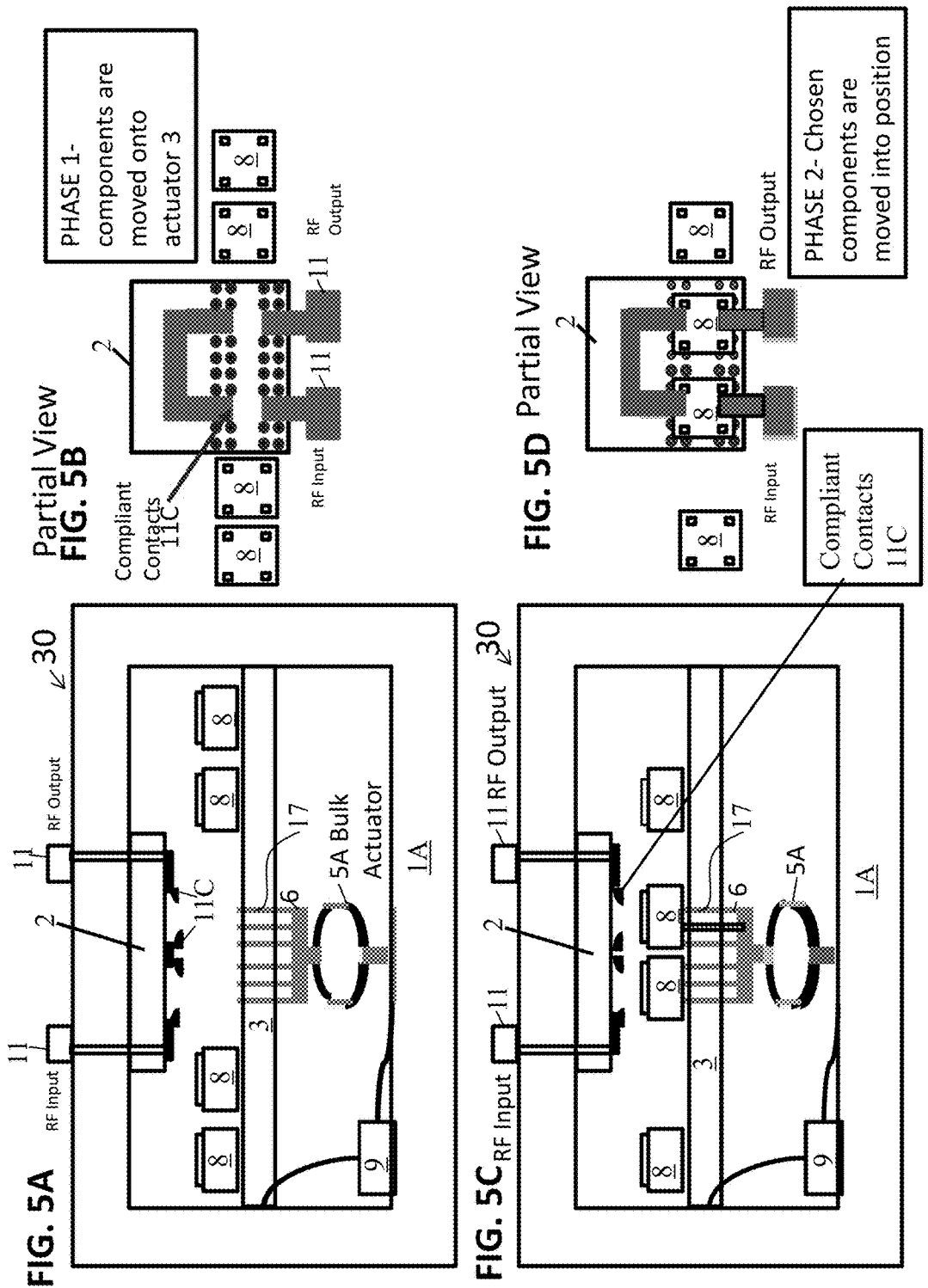

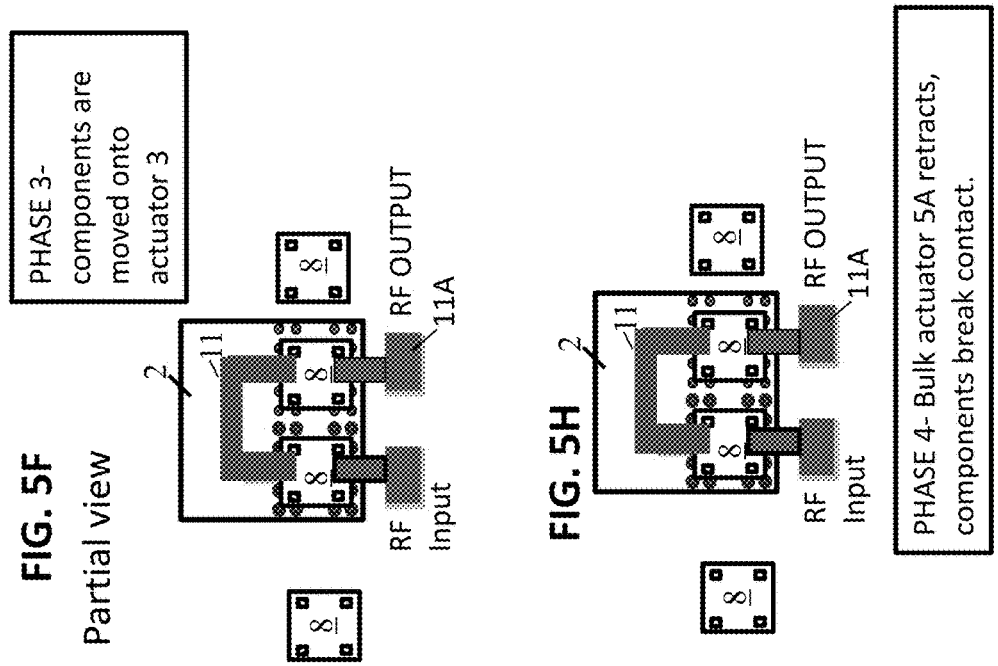
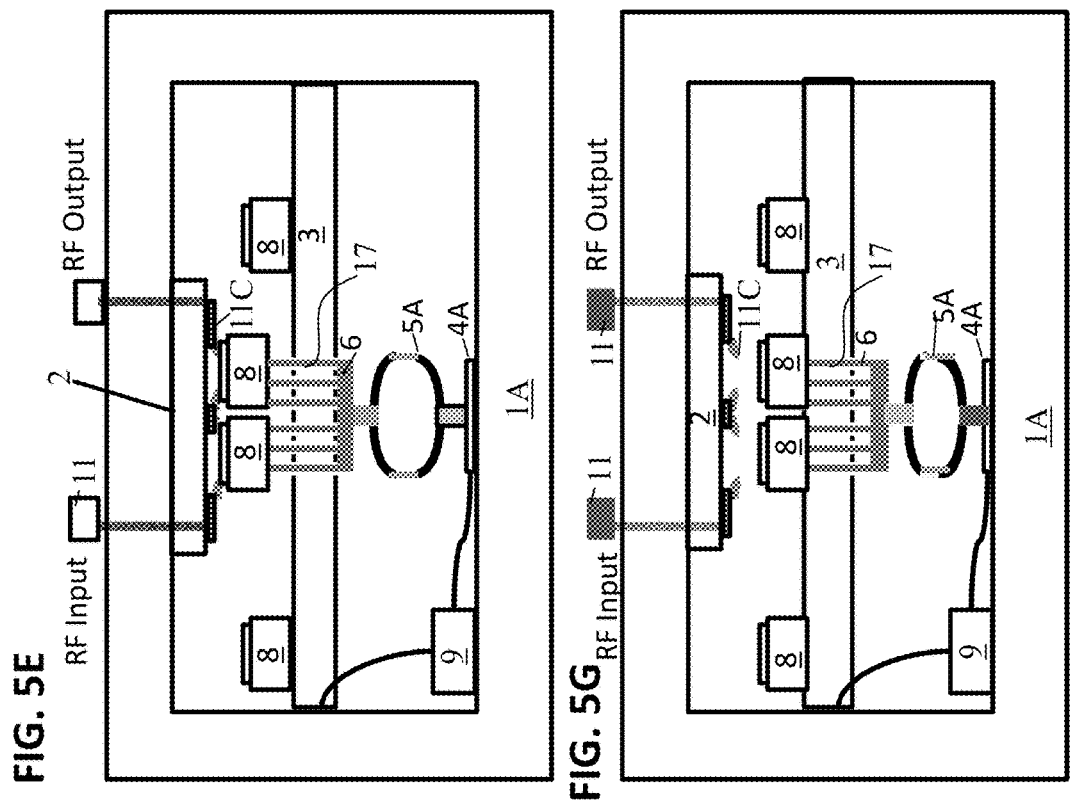

Phase 5: Circuit Components 8 removed away from interconnect substrate for reconfiguration in another circuit design (circuit configuration B)
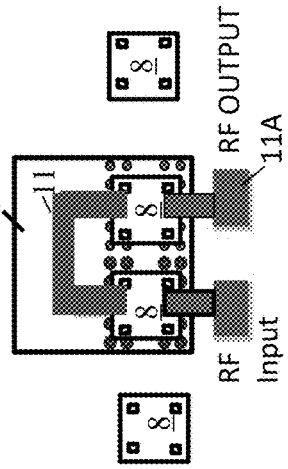
FIG. 5J Partial View
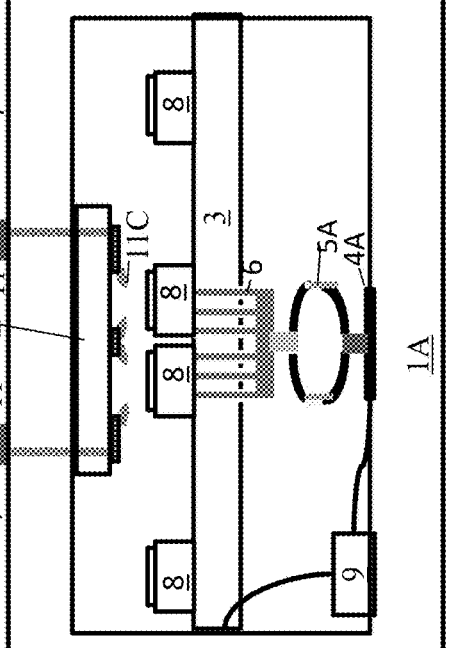
FIG. 5I RF Input
Phase 6: Bulk actuator pushes components into contact with compliant contacts on IS (circuit B)
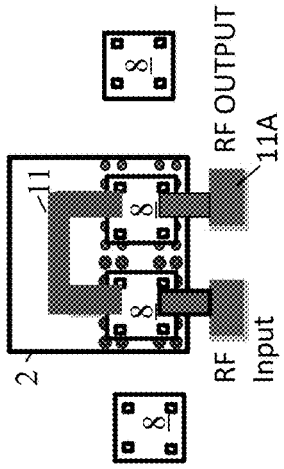
FIG. 5L
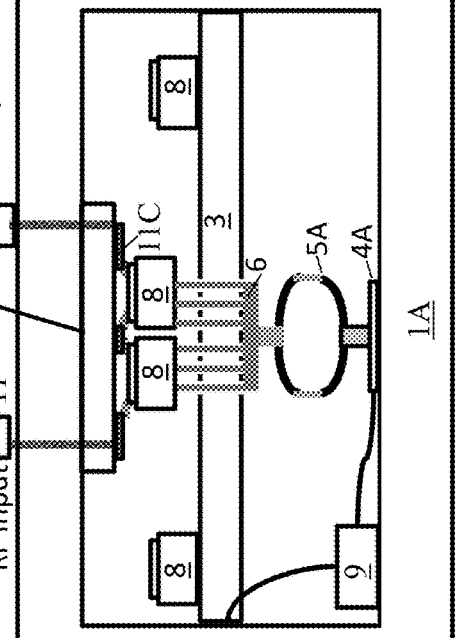
FIG. 5K RF Input

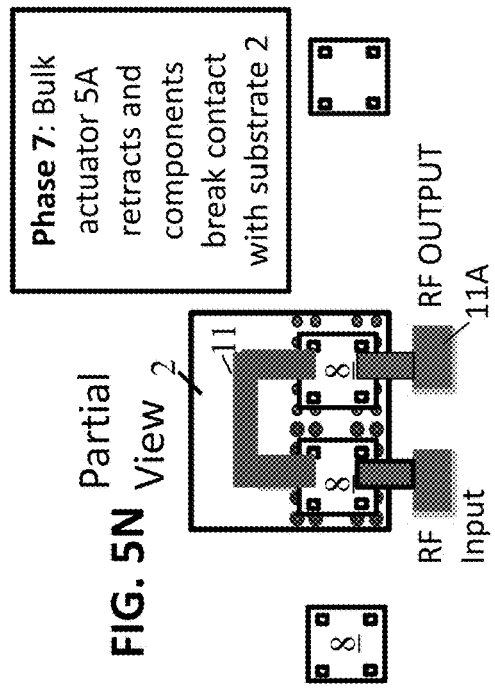
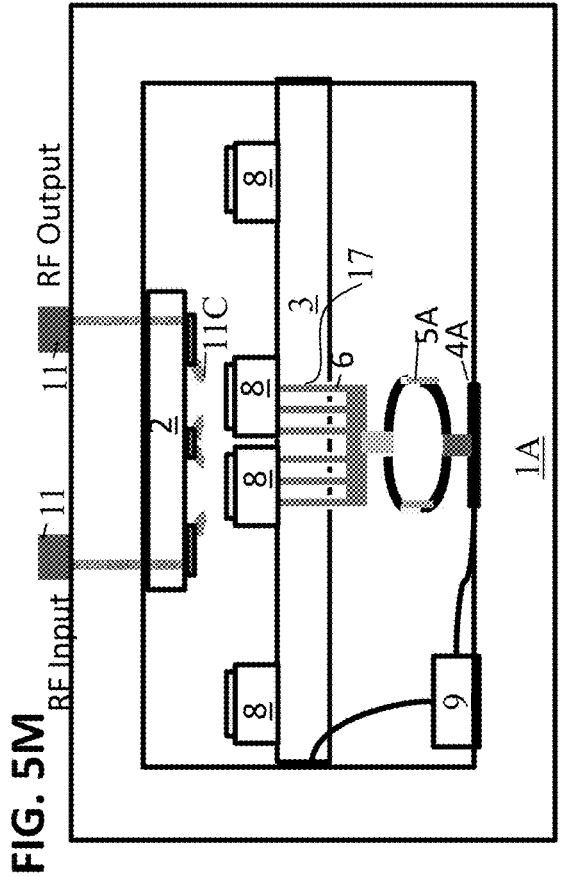

Interconnect Substrate Design

US 10,271,437 B2

MOTION-BASED RECONFIGURABLE MICROELECTRONICS SYSTEM

CROSS REFERENCE TO RELATED APPLICATIONS

This application claims priority of U.S. Provisional Application No. 62/037,534 filed on Aug. 14, 2014, entitled "Motion-Based Reconfigurable Microelectronics Platform."

STATEMENT OF GOVERNMENT INTEREST

The invention described herein may be manufactured, used, and licensed by or for the United States Government without the payment of royalties.

BACKGROUND OF THE INVENTION

This invention relates broadly to reconfigurable microelectronics. Systems that could benefit from reconfigurable circuits, particularly high frequency radio frequency (RF) circuits, include RF technologies for radar, electronic warfare, communications, and signal intelligence. The DoD over the past decade, has spent billions of dollars to develop a family of software defined military radios (JTRS) that were supposed to be universally interoperable, frequency agile, and could accommodate next generation military waveforms. However, the radios became larger and more costly as new capabilities and interoperability were included merely by adding more hardware and software. In addition to these challenges, the proliferation of wireless technologies are leading to a more crowded RF spectrum at the same time that the US government is selling off bandwidth previously dedicated to the military. One possible solution is to develop common reconfigurable RF hardware with circuits that can be programmed, reconfigured, and or adapt their functionality in response to dynamic spectral environments and mission needs. Such systems are expected to reduce upgrade, procurement, and R&D costs compared to conventional radios and radar.

SUMMARY OF THE INVENTION

The present invention is directed to a reconfigurable microelectronics platform system for accurate physical positioning of microelectronic "chips" and the parallel formation of multiple electrical contacts to achieve a reconfigurable circuit capability. The present invention is also directed to a method of operating the preferred embodiment system. The invention utilizes, inter alia, physical movement of circuit components to realize electrical reconfigurability. In addition to reconfigurable RF circuit applications, such a system represents a general "reconfigurable system in a package" that may be applied to a variety of other technologies areas such as sensors, bio-related, and or optical systems.

BRIEF DESCRIPTION OF THE DRAWINGS

The foregoing and other objects, features, and advantages of the invention will be apparent from the following more detailed description of the preferred embodiments of the invention, as illustrated in the accompanying drawings, wherein:

FIG. 3A is schematic illustration of an exemplary conventional approach to reconfiguring circuits to select or de-select chips using a hardwired switch arrays including eight switches 15 along the signal path 13.

FIG. 3B shows an equivalent circuit diagram for the invention revealing only the three switches 15 required to connect the same chips 8 as in FIG. 3A. FIG. 4A is an illustration showing a test operation as to the feasibility of an actuator surface 3A depicting an object at the left side.

FIG. 4A is an illustration showing an actuator surface 3A depicting an object at the left side.

FIGS. 5A, 5C, 5E, 5G, 5I, 5K, and 5M are illustrations showing a preferred embodiment assembly 30 in different phases.

FIG. 5A is a cross sectional illustration of preferred embodiment 30 in a phase 1 orientation.

FIG. 5B is a partial illustration of an alternate view of preferred embodiment 30 in a phase 1 orientation.

FIG. 5C is a cross sectional illustration of preferred embodiment 30 in a phase 2 orientation.

FIG. 5D is a partial illustration of an alternate view of preferred embodiment 30 in a phase 2 orientation, FIG. 5E is a cross sectional illustration of preferred embodiment 30 in a phase 3 orientation.

FIG. 5F is a partial illustration of an alternate view of preferred embodiment 30 in a phase 3 orientation.

FIG. 5G is a cross sectional illustration of preferred embodiment 30 in a phase 4 orientation.

FIG. 5H is a partial illustration of an alternate view of preferred embodiment 30 in a phase 4 orientation.

FIG. 5I is a cross sectional illustration of preferred embodiment 30 in a phase 5 orientation.

FIG. 5J is a partial illustration of an alternate view of preferred embodiment 30 in a phase 5 orientation.

FIG. 5K is a cross sectional illustration of preferred embodiment 30 in a phase 6 orientation.

FIG. 5L is a partial illustration of an alternate view of preferred embodiment 30 in a phase 6 orientation.

FIG. 5M is a cross sectional illustration of preferred embodiment 30 in a phase 7 orientation.

FIG. 5N is a partial illustration of an alternate view of preferred embodiment 30 in a phase 7 orientation. In addition, Phase 8 is described.

Figure 1:
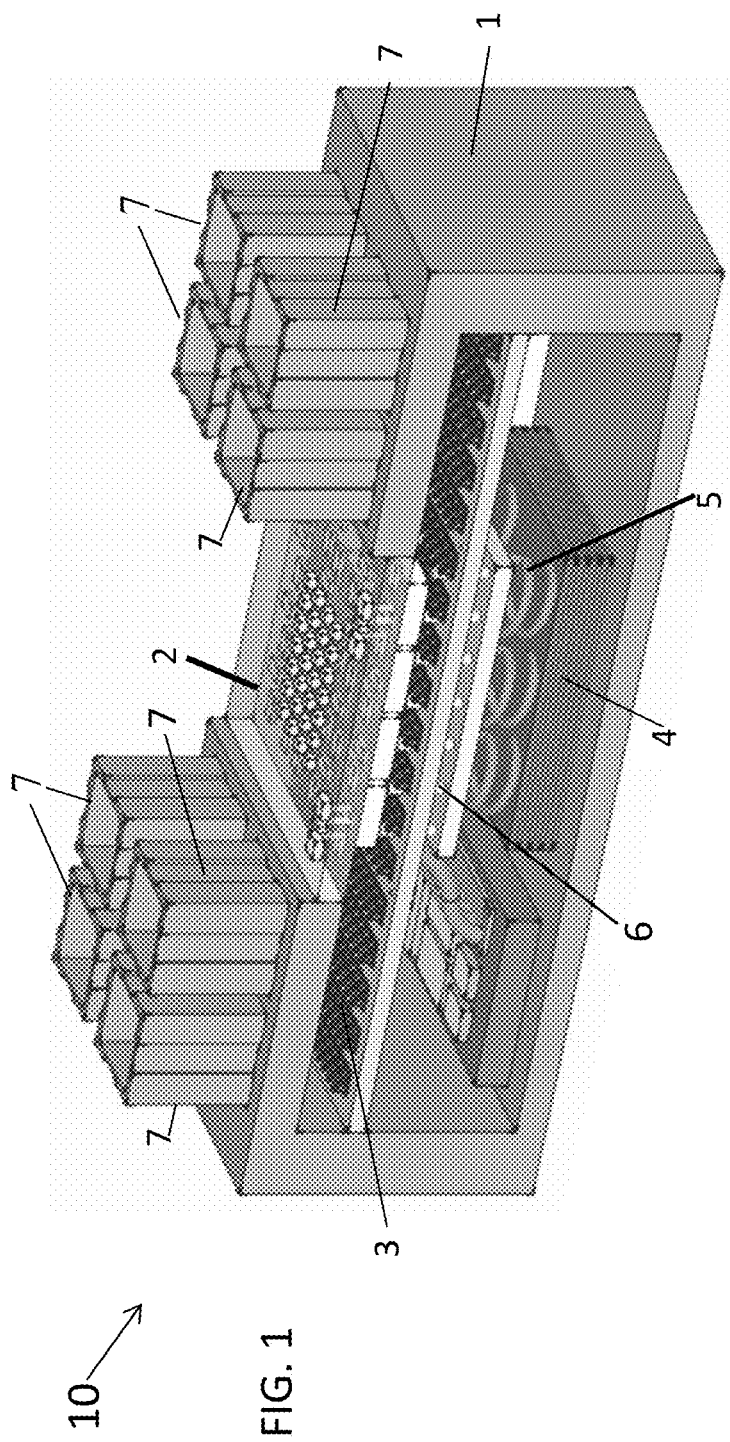
FIG. 1 is a schematic illustration of a perspective view of a preferred embodiment 10.

A more complete appreciation of the invention will be readily obtained by reference to the following Description of the Preferred Embodiments and the accompanying drawings in which like numerals in different figures represent the same structures or elements. The representations in each of the figures are diagrammatic and no attempt is made to indicate actual scales or precise ratios. Proportional relationships are shown as approximates.

DESCRIPTION OF THE PREFERRED EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention. Rather, these embodiments are provided so that this disclosure will be thorough and complete, and will fully convey the scope of the invention to those skilled in the art. In the drawings, the dimensions of objects and regions may be exaggerated for clarity. Like numbers refer to like elements throughout. As used herein the term "and/or" includes any and all combinations of one or more of the associated listed items.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as an object, layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. For example, when referring first and second actuators, these terms are only used to distinguish one actuator from another actuator. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region or object illustrated as a rectangular will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

The present invention is directed to a reconfigurable hardware platform that is agnostic to the constituent microelectronic component technologies. In contrast to approaches where "block-level" reconfiguration is achieved via arrayed components selectable by hardwired switch arrays as seen in FIG. 3A, the present invention has the capability of arbitrarily electrically connecting microelectronic chips by physically moving and assembling the constituent chips and rewiring them for each desired circuit configuration. The constituent "chips" could be die-level microelectronic and RF components such as amplifiers, filters, mixers, etc. The concept is analogous to a hardware implementation of circuit simulators like Advanced Design System (ADS), an electronic design automation software system produced by Agilent Technologies.

The present invention is directed to accurate physical positioning of microelectronic "chips" and the parallel formation of multiple electrical contacts to achieve a reconfigurable circuit capability. The invention utilizes, inter alia, physical movement of circuit components to realize electrical reconfigurability. In addition to reconfigurable RF circuit applications, such a system represents a general "reconfigurable system in a package" that could be applied to a variety of other technologies areas such as sensors, bio-related, and or optical systems.

A preferred embodiment 10 comprises a frame 1, an interconnect substrate 2, an actuator surface 3, a piezoelectric element 4, springs 5, post array assembly 6, storage magazines 7, and control electronics 9, as illustrated in FIG. 1. The system utilizes MEMS actuators to reposition and reorient the component chips on a surface. This "actuator surface" 3 has periodic holes 17 in it to accommodate an array of posts 6 that are connected to springs 5 and a piezoelectric element 4, which are located beneath the actuator surface 3. Once the chips 8 are in the proper position for a desired system configuration, the springs 5 and post array 6 displace upward and press the chips 8 into sets of electrical contacts and traces on an "interconnect substrate" 2 located above the actuator surface 3 and chips 8. This completes electrical connections between adjacent chips and any additional external electrical contacts (like biasing) that might be necessary. RF and DC input and output connections 11 to the RF circuit are available on the top side of the interconnect substrate 2. A piezoelectric actuator 4 is placed in series with the springs 5 and is used to release the spring load to allow repositioning of the chips 8. The default state of the chips 8 is to be supported by the springs 5 and the normally closed contact with the interconnects as shown in FIG. 2D. The base of the actuator/spring/post assembly (components 4, 5, and 6) is attached to both the actuator surface 3 and the interconnect substrate 2 via a rigid frame 1 that permits contact forces applied by the springs to be applied to the electrical contacts. capable of open or closed loop controlled, single chip ±X, Y horizontal and vertical motion and rotation.

The portion of the actuator surface 3 below the interconnect substrate 2 is where RF components may be assembled and connected to the system RF and DC I/Os. The regions laterally adjacent to this area correspond to the inventory and loading portion of the system. Adjacent to the interconnect substrate 2 are ports in the frame 1 that accept "magazines" 7 (as shown in FIG. 1) that contain the various microelectronic chips 8 that are to be assembled. The chips 8 are loaded into the magazines 7 and are then inserted into the system.

During system configuration, the magazines 7 load and or unload chips 8 to and from the actuator surface 3 beneath the magazines 7. The actuator surface 3 size may be in the range of 1 mm.×1 mm. to 10 cm.×10 cm. The actuator surface 3 moves and or rotates the previously stored chips into the proper positions and orientations beneath the interconnect substrate for the desired circuit configuration. The piezoelectric actuator 4 then turns off, engaging the spring 5 and post array 6 to connect the chips to each other via the interconnect substrate 2. Configuring to a new RF circuit involves activating the piezoelectric element 4 to disengage the contact, moving the unused chips back to storage, retrieving the required components and moving them into the new positions, and reengaging contact between the chips and the interconnect substrate. Programmable control electronics 9 manage this entire process by interfacing with the actuator surface, sensors embedded in the actuator surface 3, and the piezoelectric element 4. The system is programmed via an external data port connected to the control electronics 9.

Figure 2A:
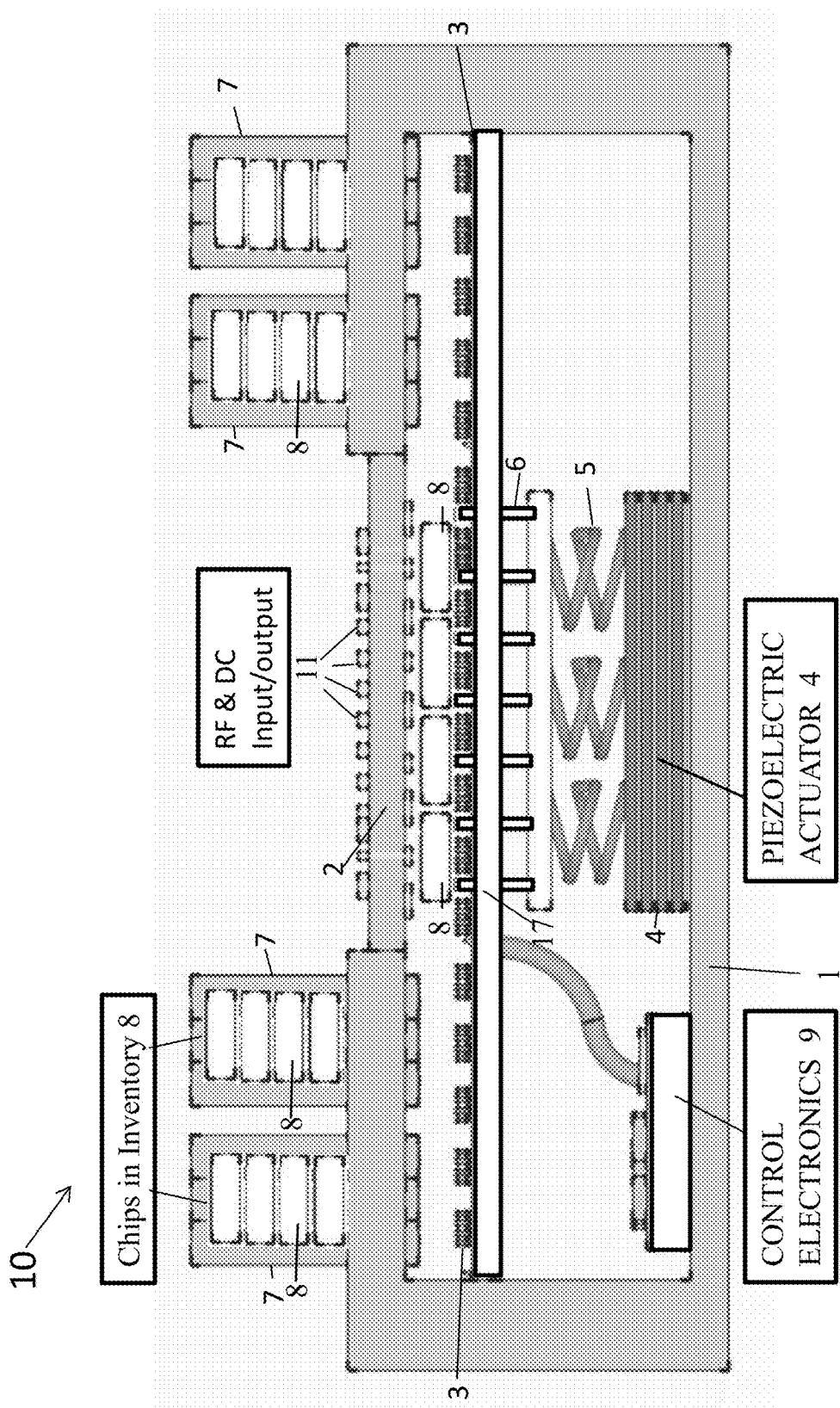
FIG. 2A is a schematic illustration of the embodiment of FIG. 1 illustrating the movement of the post array 6.

FIG. 2A is a schematic illustration of the embodiment of FIG. 1 illustrating the movement of the post array 6.

Figure 2B:
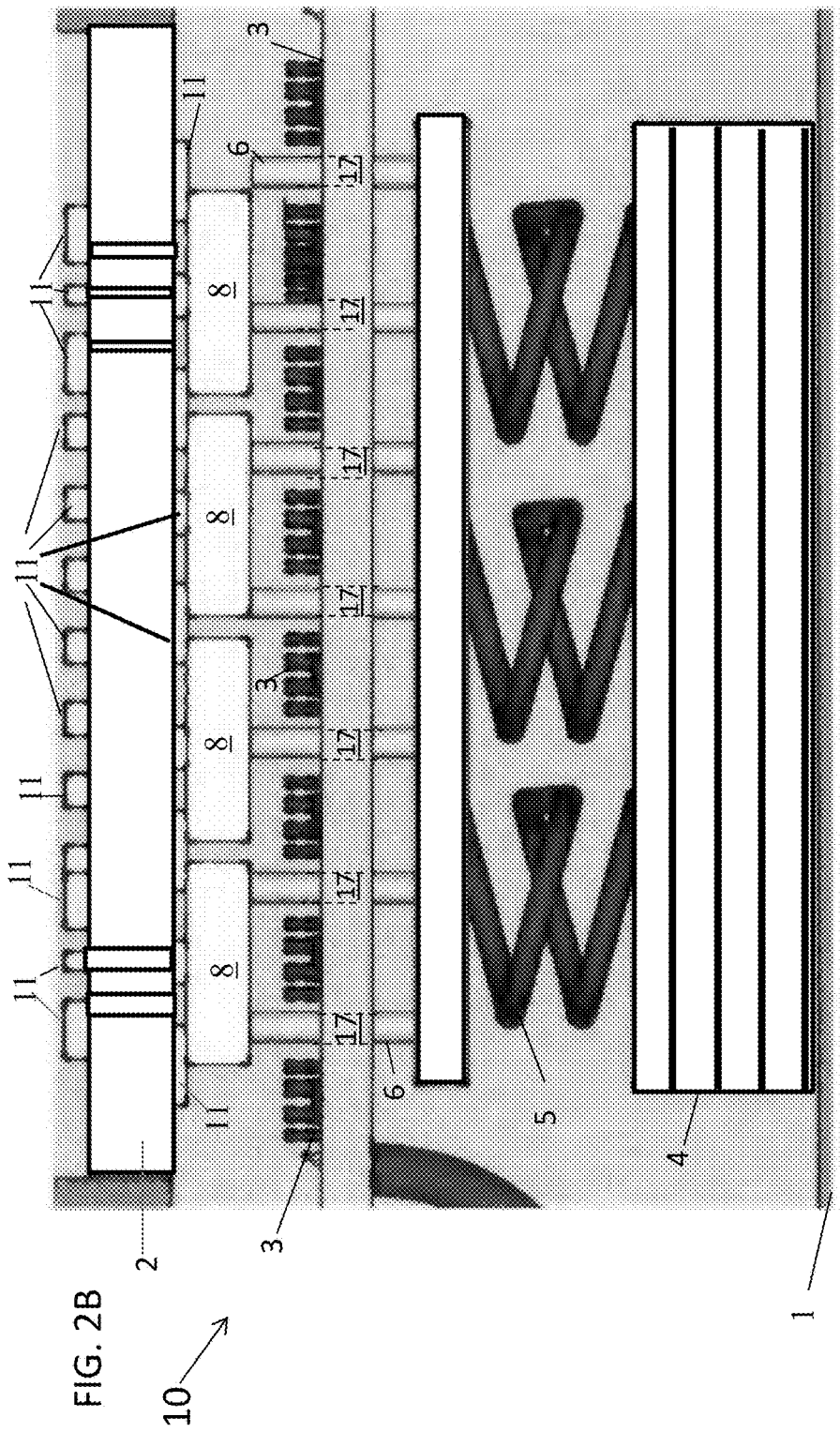
FIG. 2B is a schematic illustration of the embodiment of FIG. 1 illustrating the engagement of the post array 6 with chips 8 and the contact of chips 8 with the connections 11.

FIG. 2B is a schematic illustration of the embodiment of FIG. 1 illustrating the engagement of the post array 6 with chips 8 and the contact of chips 8 with the connections 11. FIG. 2B illustrates the contact between the chips and interconnect substrate 2. During contact, the piezoelectric element 4 is deactivated which permits the springs 5 to press the post array 6 against the chips 8, in turn, pressing the chips 8 into contact with the interconnects 11. The illustration is schematic in nature and the limited number of post/chip contacts, and components generally, are due to maintaining drawing simplicity.

Figure 2C:
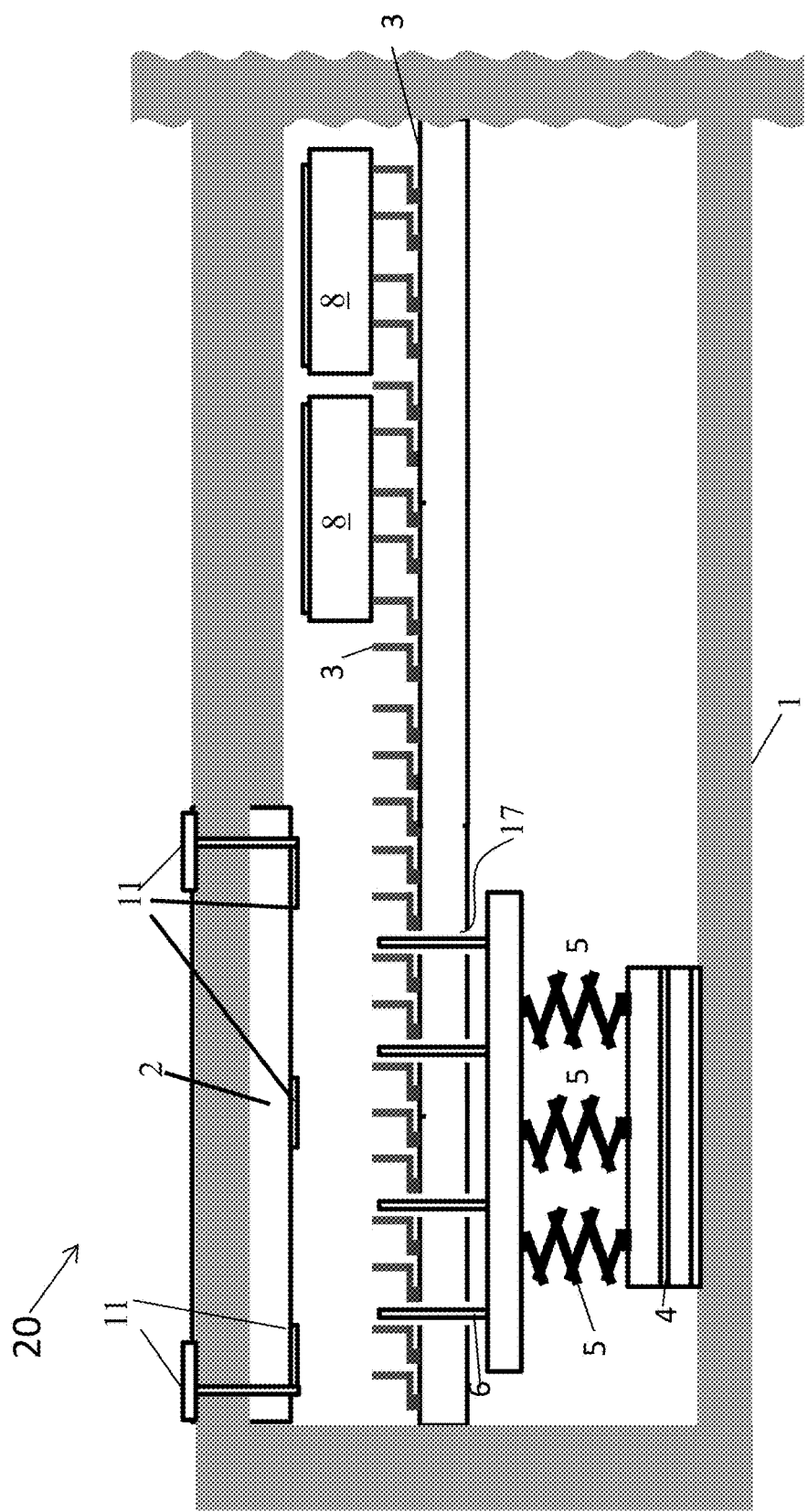
FIG. 2C is a schematic illustration of the embodiment of FIG. 1 illustrating the movement of the chips 8 along the actuator surface 3.
Figure 2D:
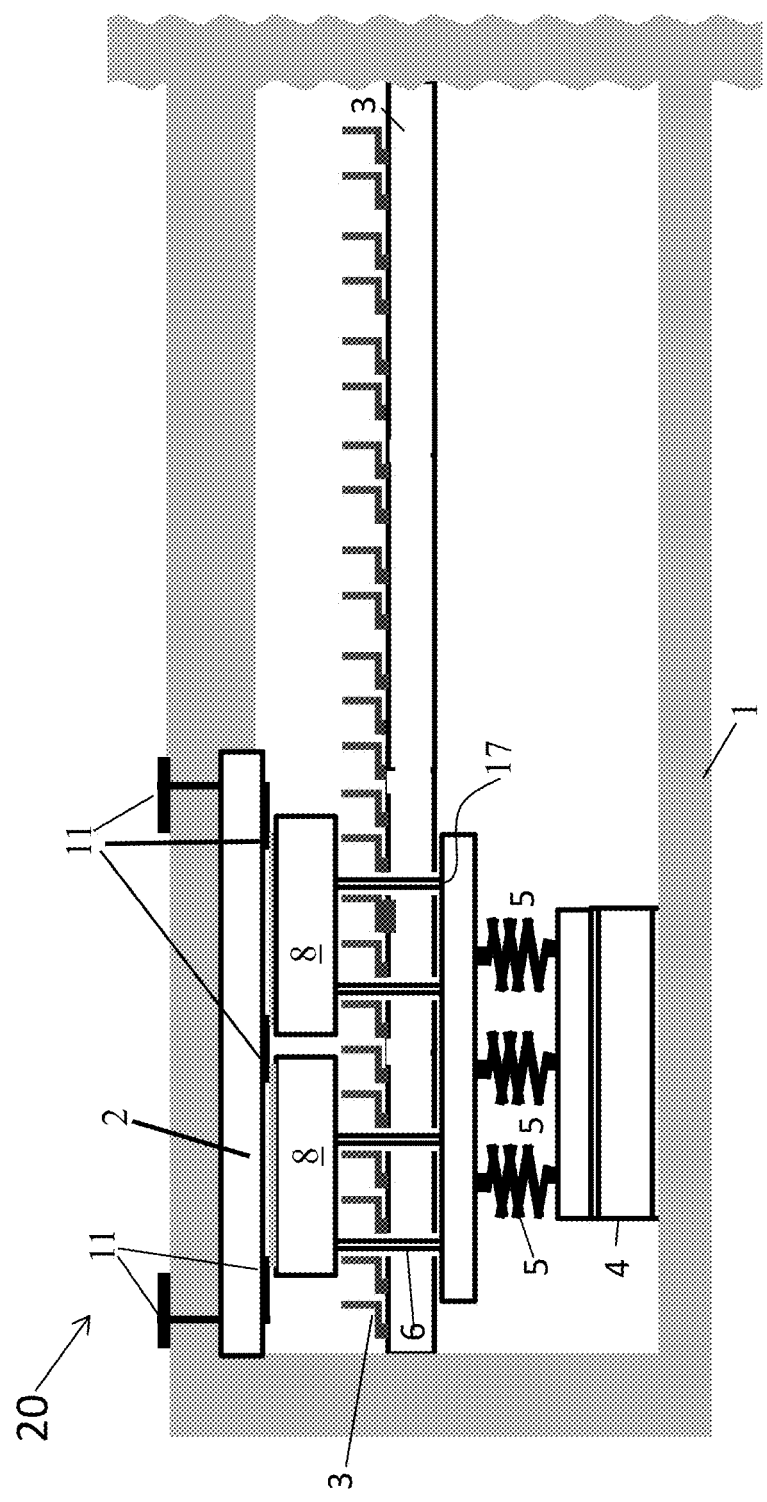
FIG. 2D is a schematic illustration of the embodiment of FIG. 1 illustrating the movement of the chips 8 along the actuator surface 3 to a location beneath post array 6 and the actuation of the piezoelectric element 4, causing the chips 8 to contact the interconnect substrate 2.

FIG. 2C is a schematic illustration of the embodiment of FIG. 1 illustrating the movement of the chips 8 along the actuator surface 3.

FIG. 2D is a schematic illustration of the embodiment of FIG. 1 illustrating the movement of the chips 8 along the actuator surface 3 to a location beneath post array 6 and the actuation of the piezoelectric element 4, causing the chips 8 to contact the interconnect substrate 2.

The successful development of a common reconfigurable electronics hardware platform could impact communications, electronic warfare, and signals intelligence by eliminating redundant and costly hardware development required for the adoption or recognition of new wireless functions or waveforms.

Reduced Switch Count and Transmission Line Length

FIG. 3A is schematic illustration of a conventional approach to reconfiguring circuits to select or de-select chips using a hardwired switch arrays including eight switches 15 along the signal path 13. FIG. 3B shows an exemplary equivalent circuit diagram for the invention revealing only the three switches 15 required to connect the same chips 8. The chips 8 not required for a given circuit design are physically moved away and the required chips are moved adjacent to one another and are connected with only 3 switches 15. The switches 15 in part (b) are formed by the piezoelectric element 4 pressing the chips 8 into physical and electrical contact with the interconnect substrate 2.

FIG. 3A illustrates a series chain of nine RF components or chips 8 connected by pairs of RF switches 15A-15P to route through or around each component. For the arbitrary case where the first and seventh chips are to be connected in series only, the topology in FIG. 3A requires eight series switches 15. The preferred embodiment concept would physically move the unused chips away, reposition the first and seventh chips adjacent to one another, and then rewire the connections with a total of three switches (as shown in FIG. 3B). For the series chain case, the switch array approach requires (X−1) RF switches where X is the total number of components and the alternate preferred embodiment approach only requires (2+n) where n is the number of inter-chip connections. This example highlights that the alternate preferred embodiment architecture scales far better and can dramatically reduce the number and loss of switches, and delay and loss of routing transmission lines and thus positively impact system performance.

Figure 4B:
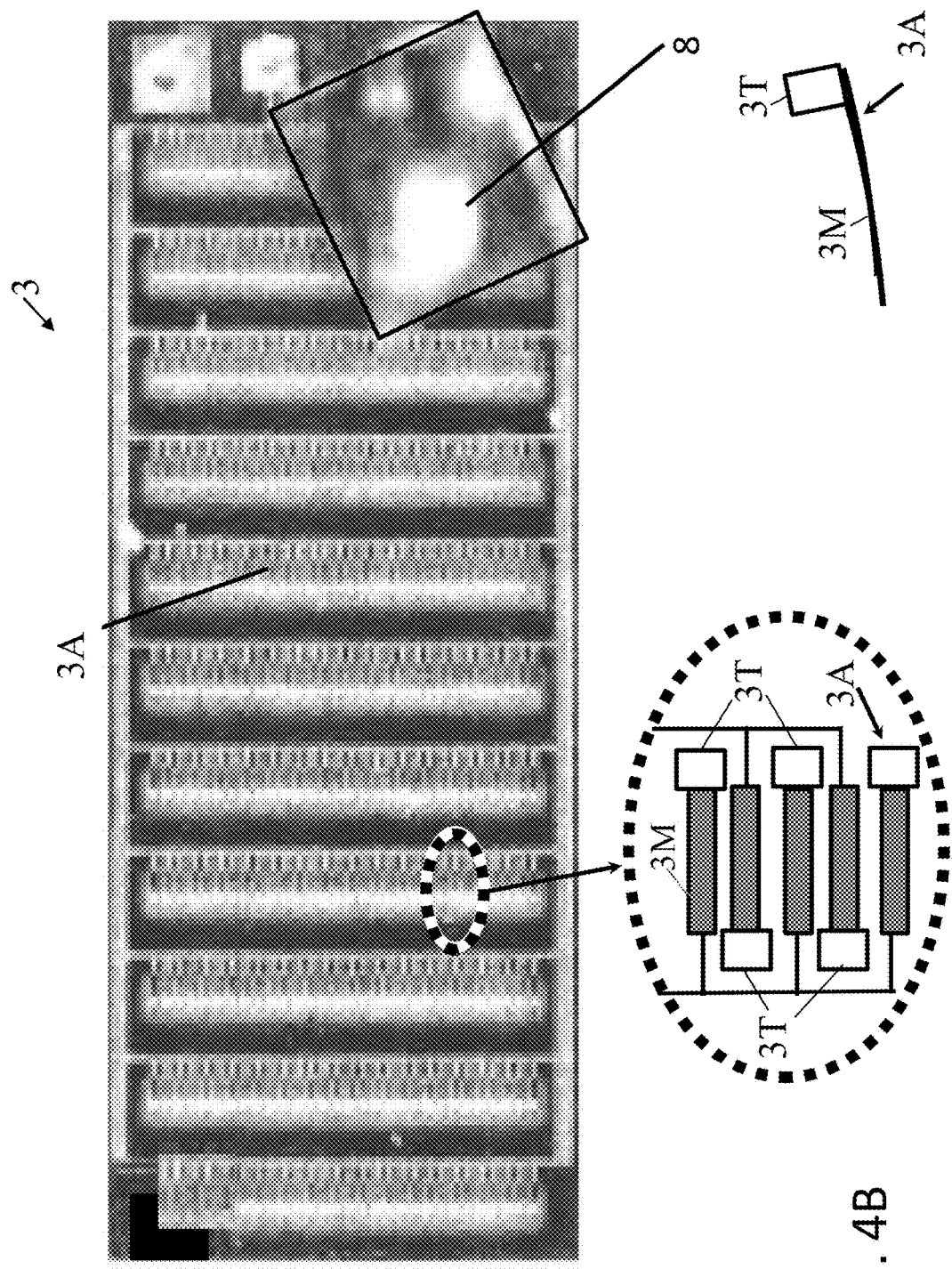
FIG. 4B is an illustration showing a test operation of the actuator shown in FIG. 4A in which the object is moved to the right side.

Referring now to FIGS. 4A and 4B, shown is the actuator surface 3 comprising arrays of PiezoMEMS unimorph cantilevered actuators 34 having a mid-section or cantilever portion 3M with tall (~30 um) copper posts 3T at the free end. The tall copper posts 3T amplify the lateral displacements along the long axis of the actuator 3. Chips 8 atop the actuator posts 3T will displace along with the actuators. The actuators 3A are mounted opposite one another to permit lateral displacement in either direction. Lateral displacements are on the order of microns per cycle. Exciting the actuators 3A with a periodic asymmetric ramped waveform (through the electrical connection 3E) allow the chip displacements to be rectified and "stick and slip" contact behavior that permits drive frequency to control chip velocity.

FIG. 4B illustrates the actuator surface 3 of FIG. 4A with the object (which may be a chip 8) displaced to the right side of the figure. The MLM-PZT Process can be used to produce actuator 3, with either 1-D or 2-D (x, y) arrays. As to the 1-D array, the orientation determines actuation direction. The preferred array is approximately 50 µm long cantilevered unimorph actuators arranged in 11 rows×30 columns (2.4 mm×0.91 mm array area. The 2-D array accommodates bi-directional controlled displacements.

Referring now to FIGS. 5A, 5C, 5E, 5G, 5I, 5K, and 5M, shown therein is a preferred embodiment assembly 30. The sequence of illustrations depicts various positions of the actuator surface 3 and related components. For example, FIGS. 5A and 5B show the beginning phase (components or chips 8 are either loaded onto actuator surface 3 from storage magazines (not shown) or are initially located on actuator surface 3 (to the left and right of the interconnecting substrate 2)).

Shown in FIGS. 5A, 5C, 5E, 5G, 5I, 5K, and 5M is a bulk actuator 5A (which functions in a similar manner to the actuator 5 described above), post array 6, actuator surface 3, and interconnect substrate 2. Specifically, the preferred embodiment 30 shown in FIGS. 5A, 5C, 5E, 5G, 5I, 5K, and 5M comprises a frame 1, an interconnect substrate 2, an actuator surface 3, a piezoelectric element 4A, springs 5A, post array assembly 6, storage magazines 7, and control electronics 9. The system utilizes MEMS actuators to reposition and reorient the component chips on a surface. This "actuator surface" 3 has periodic holes 17 in it to accommodate an array of posts 6 that are connected to bulk actuator 5A and piezoelectric element 4A, which are located beneath the actuator surface 3. Once the chips 8 are in the proper position for a desired system configuration, the bulk actuator 5A and post array 6 displace upward and press the chips 8 into sets of electrical contacts and traces on an "interconnect substrate" 2 located above the actuator surface 3 and chips 8. This completes electrical connections between adjacent chips and any additional external electrical contacts (like biasing) that might be necessary. RF and DC input and output connections 11 to the RF circuit are available on the top side of the interconnect substrate 2. A piezoelectric component 4A is placed in series with the bulk actuator 5A and is used to release the spring load to allow repositioning of the chips 8. The default state of the chips 8 is to be supported by the bulk actuator 5A and the normally closed contact with the interconnects as shown in FIG. 5B. The base of the actuator/spring/post assembly (components 4A, 5A, and 6) is attached to both the actuator surface 3 and the interconnect substrate 2 via a rigid frame 1A that permits contact forces applied by the springs to be applied to the electrical contacts. The actuator surface 3 is capable of open or closed loop controlled, single chip ±X, Y horizontal and vertical motion and rotation.

The portion of the actuator surface 3 below the interconnect substrate 2 is where RF components may be assembled and connected to the system RF and DC I/Os. The regions laterally adjacent to this area correspond to the inventory and loading portion of the system. Adjacent to the interconnect substrate 2 are ports in the frame 1 that can optionally accept "magazines" 7 (as shown in FIG. 1) that contain the various microelectronic chips 8 that are to be assembled. Alternatively, the chips 8 may be loaded into the magazines and then inserted into the system.

As stated above, FIGS. 5A though 5M show the operation of the preferred embodiment 30 in a sequence of phases. Phase 1 is the beginning. Phase 2 is shown in FIGS. 5C and 5D. In Phase 2, the chosen circuit components 8 (for circuit configuration A) are moved/orientated by actuator surface 3 to correct location beneath interconnect substrate 2.—Note although the third dimension is not shown; components 8 do not obstruct one another.

Phase 3 is shown in FIGS. 5E and 5F. The bulk actuator 5A pushes selected components 8 into contact with compliant contacts on interconnect substrate 2 (circuit is reconfigured as circuit A)

Phase 4 is shown in FIGS. 5G and 5H. The bulk actuator 5A retracts and components 8 break contact with interconnect substrate 2.

Phase 5 is shown in FIGS. 5I and 5J. The circuit components 8 are moved away from interconnect substrate 2 and other circuit components 8 (for circuit configuration B) are moved/orientated by the actuator surface 3 to correct location beneath interconnect substrate 3 for circuit configuration B, an alternate circuit design.

Phase 6 is shown in FIGS. 5K and 5L. The circuit components 8 are moved away from the interconnect substrate 2 and circuit components (for circuit configuration B) are moved/orientated by the actuator surface 3 to the correct location beneath interconnect substrate 2 for circuit configuration B.

Phase 7 is shown in FIGS. 5M and 5N. The bulk actuator 5A retracts and components 8 break contact with the interconnect substrate 2.

Phase 8 is described in FIG. 5N. In Phase 8, two possibilities exist. Either (1) the components are returned to the Phase 1 state or (2) new components 8 are chosen similar to Phase 5 but the chosen components 8 may comprise circuit configurations A, B, or some other possible combination of available components.

Figures 6A, 6B:
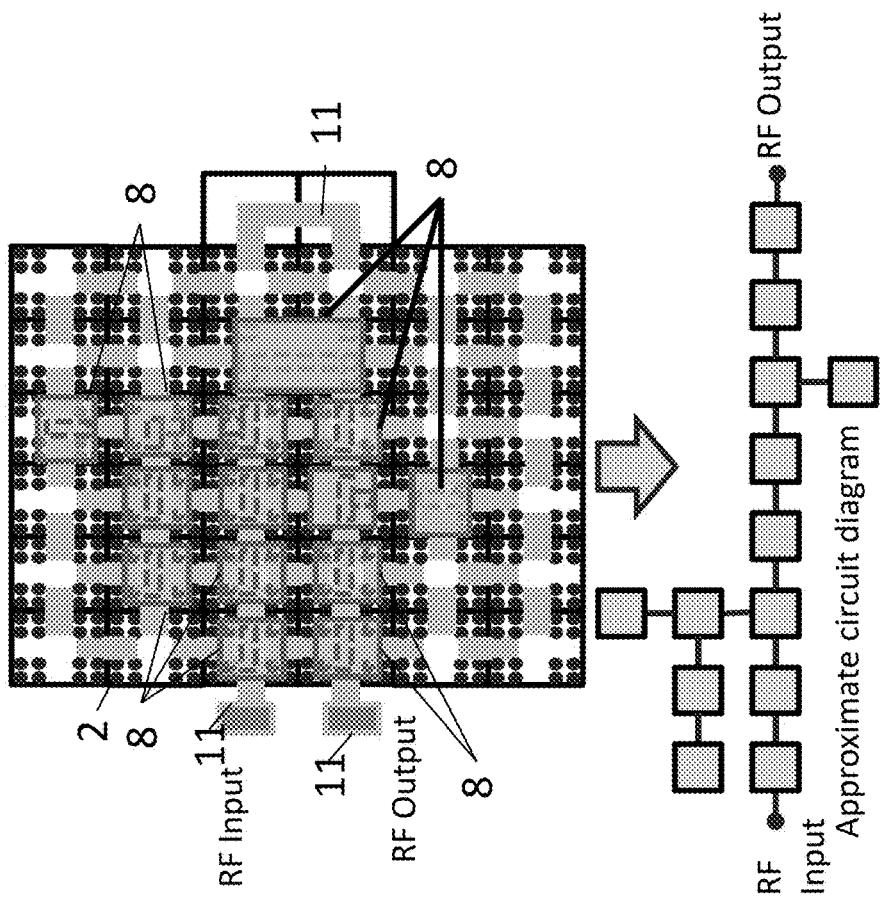
FIG. 6A is a schematic illustration depicting an interconnect substrate design.
FIG. 6B is a schematic illustration depicting an alternate interconnect substrate design.

FIG. 6A is a schematic illustration of an interconnect substrate 2. Also shown in FIG. 6A are connectors 11 which may be connected to an RF input and an RF output.

FIG. 6B is a schematic illustration of an alternate interconnect substrate 2. Also shown in FIG. 6B are connectors 11 which may be connected to an RF input and an RF output and also to components or chips 8.

Component Technology Agnostic:

The technology of the present invention inherently features heterogeneous integration; facilitating future wireless standard adoption and utilization of the best components. This would eliminate the difficult system level tradeoffs involved with monolithic integration approaches. Chips from any fabrication process, such as GaAs, GaN, MEMS, CMOS, InP, bulk machined components, etc., could be utilized by the preferred embodiment system. Chips intended for use with the preferred embodiments may require a simple post-processing deposition of an unpatterned thick film to ensure all chips are of a uniform thickness to avoid added design complexity.

Upgradability:

The preferred embodiments would offer significant advantages for upgradability. In contrast to a hardwired switch array approach, systems of the preferred embodiments could easily incorporate changes in the state of the art of RF component technologies. The latest and greatest amplifier or filter technology could be loaded into the system and upgraded as easily as inserting a new magazine and programming the controller with the properties of the new components.

System Reliability:

The systems of the preferred embodiments would also benefit from component fault tolerance; failed components could be detected and replaced from inventory.

Standardization:

The systems of the preferred embodiments would provide standardization not by constraining the component technologies with new standards but by decoupling component technology standards from system integration. This would provide an "interchangeable parts" characteristic to RF electronics.

Testing:

RF circuits, unlike other electronics, often require custom design and post-assembly tuning of the circuits; circuit simulation alone is rarely adequate to achieve optimal performance. Systems of the preferred embodiments would simplify the testing of new circuits intended for use and provide an efficient R&D tool for rapid prototyping.

Figure 4C:
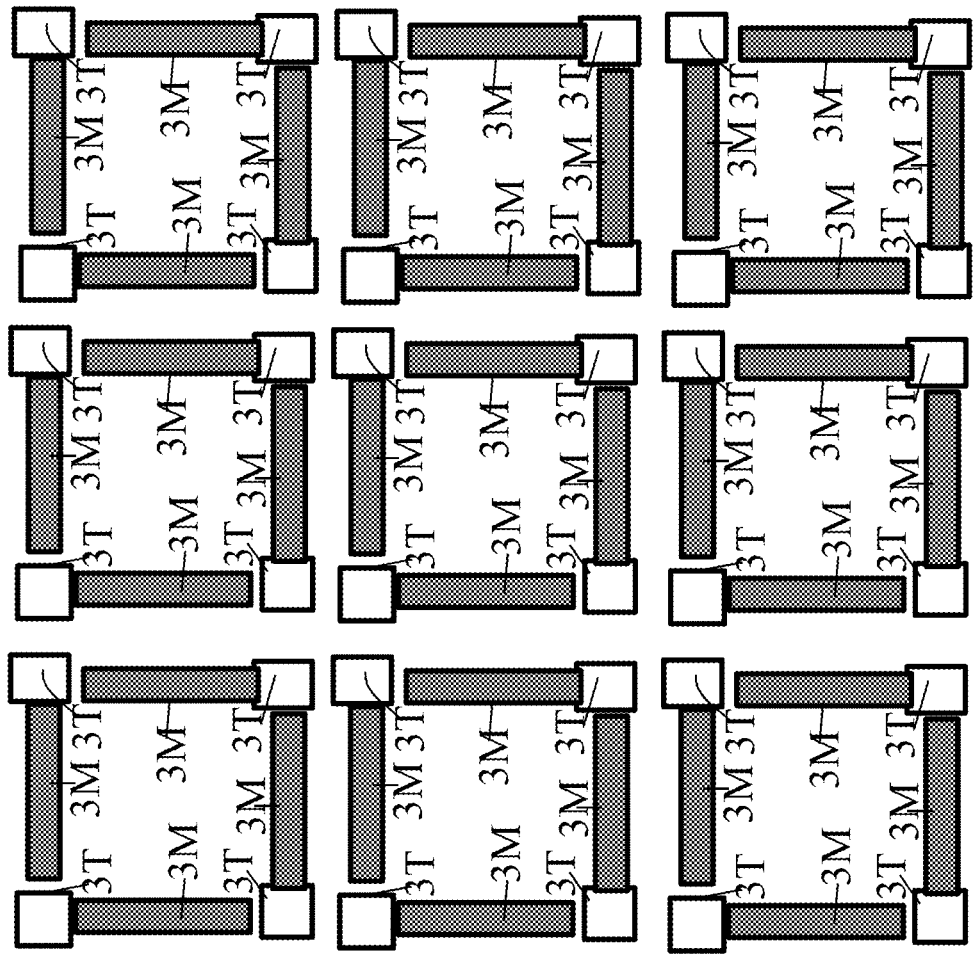
FIG. 4C is a schematic illustration showing a two dimensional actuator surface.

In order to minimize component complexity, the preferred embodiments utilize standard and proven mechanical devices to the greatest extent possible, and exploiting the unique capabilities of piezoelectric MEMS technologies to realize the actuator surface functionality. The systems of the preferred embodiments may, for example, utilize lead zirconate titanate (PZT) piezoelectric MEMS with multilayer copper technology (i.e. PZT-Cu MEMS) for both actuation and position sensing. The prototypes consist of arrays of PiezoMEMS unimorph cantilevered actuators (3) with tall (~30 um) copper posts (3T) at the distal end of the structures, as seen in FIGS. 4A through 4C. When actuated, the tall copper posts 3T amplify the lateral displacements along the long axis of the actuator. A chip that is resting on the top of an array of actuated posts will displace along with the actuators. These lateral displacements are on the order of microns per cycle. However, exciting the actuators with a periodic asymmetric ramped waveform allows the chip displacements to be rectified with a "stick and slip" contact behavior that permits drive frequency to control chip velocity. This results in a smooth unidirectional motion of the chips. FIG. 4A illustrates a unidirectional test actuator array displacing a 0.5 mm cubic chip several millimeters with a maximum controlled velocity of 2.5 mm/sec. The actuator array consumes very little power (<1 uW for a 2.5 mm×1 mm array) and operates at very low voltages (1-10V). Velocities as high as ~2 cm/sec have been observed. It is expected that significantly higher speeds are achievable with the current prototypes. Much larger chips (~5 mm×5 mm×0.5 mm) have also been displaced repeatedly with similar speeds. Bi-directional chip motion with actuator designs intended for ±xy motion is shown in FIG. 4C.

The interconnect substrate 2 may be comprised of arrayed RF and DC interconnects that are electrically isolated from one another and positioned to accommodate predefined chip contact locations. The interconnect substrate may comprise a low-loss RF substrate with vias to backside contacts as depicted in FIG. 1. The post array 6 will either be manufactured with MEMS based processing and electroplating or may utilize traditional machined structures if process tolerances permit. Standard bulk machined springs 5 may be utilized. A variety of piezoelectric elements 4 may be utilized including piezoelectric stack actuators and flextensional devices. Two concepts for the loading and unloading of the magazine devices 7, including spring loaded structures similar to the mechanisms utilized in the magazines of firearms and designs that interface with additional actuators located on the actuator surface.

MEMS components are only used to position the chips and that bulk high force and displacement actuators and springs are used to realize the electrical contacts and to provide sufficient contact forces to minimize resistive losses. The MEMS components do not need to support large loads or electrically active contacts.

The following are a number of optional features of the preferred embodiment systems.

Accurate chip positioning: Piezoelectric actuation offers the potential for nanometer spatial resolution. Since complex contact behavior with the preferred embodiment designs can lead to unacceptable spatial drift, robustness to shock and vibration can be accommodated by close loop positional control that necessitates the development and integration of positional sensing.

Reconfiguration speed: Significant performance improvements are expected with optimization as chip speeds on the order of 10 cm/sec or greater are feasible and with the optional ability to position multiple chips simultaneously, total reconfiguration times on the order of milliseconds to seconds are expected.

Electrical contact performance and reliability: Ensuring good electrical contact across multiple parallel contact surfaces requires the use of large force and displacement bulk actuators with interconnect contact compliance. The routine use of "probe cards" in semiconductor test and evaluation demonstrate the feasibility.

Reconfiguration with arbitrary orientation: As a further option, the ability of the system to reconfigure while inverted or at large angles relative to gravity requires optional additional mechanical constraints such as additional actuation or compliant mechanical contacts that fully support the chips independent of system orientation.

Shock, vibration, and temperature sensitivity: The optional use of additional mechanical constraints and close loop positional control are expected to mitigate shock, vibration, and temperature sensitivity.

Magazine load/unload actuation: Optional actuators may be used to operate the loading and unloading of chips 8 stored in the magazines 7

Thermal Management of Component Chips: The limited mechanical contact between the chips 8 and the frame 1 will limit the heat sink capability of the system. Optional inclusion of additional thermal contact to the chips and or integrated cooling may be utilized, but may complicate the integrated design of the preferred embodiment systems.

Optionally, the capabilities of the preferred embodiment systems could be further extended by the following.

Device level reconfigurability with Chiplets: Further miniaturization of the actuator surface structures, the post array, and interconnect substrate features could permit the preferred embodiments to assemble not only entire "block-level" chips but construct those components from device-level chiplets. This would permit component level as well as system level reconfigurability.

Reconfigurable interconnects: Static interconnect features at predefined locations place requirements on component chip size, contact pad locations, and transmission line design. An optional reconfigurable interconnect substrate with PiezoMEMS actuation provides adaptable interconnects that could stretch and or rotate to reach arbitrary contact pad locations while maintaining proper impedance and low insertion loss. Moreover, such optional, adaptable interconnects provide interconnects to a variety of transmission line designs including transitions, for example, from conventional coplanar waveguide (CPW) to microstrip.

Integrated tunable passives: An optional reconfigurable interconnect substrate could also provide tunable passives in the interconnect substrate; including varactors, tunable inductors, attenuators, and tunable matching networks that could be switched into and out of the network as required; for one possible example, to dynamically impedance match adjacent chip components to achieve optimal system performance.

The invention is intended to solve numerous problems. The function of the invention is to provide a universal platform for reconfigurable circuits. The system should accommodate COTS electronics in "chip" form or "packaged" form and be able to rewire them without the need for complex and costly monolithic or alternative heterogeneous integration.

Commercial applications of the preferred embodiments include reconfigurable RF electronics for next-generation handheld electronics, including but not limited to cell phones. The commercial telecommunications market faces similar technical challenges as the military in terms of an ever-growing crowded RF spectrum and a market which continues to demand greater functionality and bandwidth at low costs. The invention presents three general categories of application in this context: the invention could serve as 1) a rapid prototyping capability for the research and development of RF circuits and, 2), a testing system for the determination of "known good die" for chips intended for other heterogeneous integration processes, 3) and a reconfigurable electronics platform deployed in consumer electronics for "in-field" circuit reconfiguration.

As used herein the word "microchip" or "chip" means a small piece of semiconductor material carrying a plurality of integrated circuits.

As used herein the terminology base means chassis, physical frame, structure, foundation, or support.

As used herein the terminology "substrate" includes a circuit board. The terminology substrate means a sheet of insulating material used for the mounting and interconnection (often by a printed circuit) of components, or a piece of material on which printed or integrated circuits are installed.

As used herein the terminology "proximity" means nearness in space, close to the actual, the quality or state of being proximate.

Obviously, many modifications and variations of the present invention are possible in light of the above teachings. It is therefore to be understood that, within the scope of the appended claims, the invention many be practiced otherwise than as specifically described.

The invention claimed is:

1. A system for creating reconfigurable circuits comprising:
   a support that supports a substrate;
   a first actuator operatively associated with the support comprising a plurality of actuator elements arranged in an array on a surface of the first actuator that are configured to move circuit components to locations on the first actuator which align with the substrate;
   a second actuator operatively associated with the first actuator configured to move the circuit components from the locations on the first actuator upward and into physical contact with the substrate; and
   control circuitry configured to control the first and second actuators to thereby position and reposition the circuit components in different reconfigurable configurations relative to the substrate,
   whereby circuit function is determined by selection of the circuit components and location and orientation of the circuit components relative to the substrate for a particular reconfigurable configuration, and
   wherein (i) circuit components in the reconfigurable configuration which are not needed in a subsequent reconfigurable circuit are moved out of the subsequent reconfigurable configuration with the first actuator before creating the subsequent reconfigurable circuit, and (ii) circuit components which were not included in the reconfigurable configuration and will be needed in the subsequent reconfigurable circuit are moved into the subsequent reconfigurable configuration with the first actuator before creating the subsequent reconfigurable circuit.

2. A system for controlled motion of circuit components to create reconfigurable circuits comprising:
   a support;
   a substrate operatively associated with the support;
   at least two conductors arranged to electrically connect circuit components when electrical contacts of circuit components are placed in contact with the at least two conductors;
   a first actuator operatively associated with the support comprising a plurality of actuator elements arranged in an array on a surface of the first actuator that are configured to physically move circuit components horizontally to locations on the first actuator which align with the substrate;
   a second actuator operatively associated with the first actuator configured to move the circuit components vertically from the locations on the first actuator upward and into electrical contact with the at least two conductors,
   wherein the second actuator is connected to posts which engage a bottom of the circuit components, and the first actuator comprises openings which permit the posts to displace relative thereto; and
   control circuitry configured to control the first and second actuators to thereby position and reposition the circuit components in different reconfigurable configurations relative to the substrate,
   whereby circuit function is determined by selection of the circuit components and location and the orientation of circuit components relative to the substrate and the at least two conductors for a particular reconfigurable configuration.

3. The system of claim 2 wherein the support supports the first and second actuators and the substrate; and wherein the control circuitry comprises a micro-controller.

4. The system of claim 2 further comprising at least one microelectromechanical systems (MEMS) actuator element operatively connected to the control circuitry wherein actuation of the MEMS actuator element causes the second actuator to disengage and release the circuit components from physical contact with the substrate and electrical contact with the at least two conductors.

5. The system of claim 2 further comprising at least one storage assembly for storage of circuit components and wherein the circuit components comprise a plurality of different circuit components positioned in the at least one storage assembly such that the control circuitry is configured to select different circuit components for different reconfigurable configurations.

6. The system of claim 2 wherein at least one circuit component is temporarily attached to a substrate and electrically connected in a circuit by the second actuator to allow for measuring and testing of the at least one circuit component relative to the circuit configuration and subsequently released.

7. The system of claim 2 wherein the circuit components comprise die level chips, packaged electronic devices, amplifiers, filters, mixers, and/or other high frequency electronic devices.

8. The system of claim 2 further comprising at least one magazine for storage of circuit components; and wherein the array of actuator elements of the first actuator comprise piezoelectric MEMS actuators forming an actuator surface which move the circuit components from the at least one magazine to the locations on the first actuator; and wherein the second actuator comprises a piezoelectric actuator and at least one spring, the piezoelectric actuator operating to allow extension of the springs in a first mode and compress the springs in a second mode such that the circuit components are biased against the substrate in the first mode and spaced from the substrate in the second mode.

9. The system of claim 2 further comprising RF and DC electrical connections which connect to the substrate and the circuit components.

10. The system of claim 1 further comprising a base; at least one input adapted to input electronic components operatively associated with the base; and a release for releasing the second actuator for repositioning and/or removal of at least one circuit component relative to the substrate and allowing return of the at least one circuit component to the first actuator; and wherein the array of actuator elements of the first actuator form a movable surface adapted to move a circuit component from the input to a location on the first actuator which aligns with the substrate; and wherein the second actuator operates to position at least one circuit component and hold the at least one circuit component into physical contact with the substrate and electrical contact with the conductors; and wherein the at least one circuit component is temporarily attached to a substrate and electrically connected in a circuit to allow for measuring and testing of the at least one circuit component relative to the circuit configuration and subsequently released to enable measuring and testing of alternate configurations.

11. The system of claim 1, wherein the actuator elements in the array of the first actuator comprise a plurality of 1-dimensional or 2-dimensional actuators arranged in the array.

12. The system of claim 1, wherein actuator elements in the array of the first actuator are configured to move the circuit components vertically, horizontally, and rotationally.

13. The system of claim 2, wherein (i) circuit components in the reconfigurable configuration which are not needed in a subsequent reconfigurable circuit are moved out of the subsequent reconfigurable configuration with the first actuator before creating the subsequent reconfigurable circuit, and (ii) circuit components which were not included in the reconfigurable configuration and will be needed in the subsequent reconfigurable circuit are moved into the subsequent reconfigurable configuration with the first actuator before creating the subsequent reconfigurable circuit.

14. The system of claim 1, wherein the second actuator is connected to posts which engage a bottom of the circuit components, and the first actuator comprises openings which permit the posts to displace relative thereto.

* * * * *